United States Patent [19]

Smith

[11] Patent Number: 4,647,959
[45] Date of Patent: Mar. 3, 1987

[54] INTEGRATED CIRCUIT PACKAGE, AND METHOD OF FORMING AN INTEGRATED CIRCUIT PACKAGE

[75] Inventor: Kenneth R. Smith, Aloha, Oreg.
[73] Assignee: Tektronix, Inc., Beaverton, Oreg.
[21] Appl. No.: 736,204
[22] Filed: May 20, 1985
[51] Int. Cl.[4] .............................................. H01L 23/02
[52] U.S. Cl. ..................................... 357/74; 357/81; 357/79
[58] Field of Search ....................... 357/70, 72, 74, 79, 357/81; 29/589, 831

[56] References Cited

U.S. PATENT DOCUMENTS

| | | | |
|---|---|---|---|
| 3,780,352 | 12/1973 | Redwanz | 357/74 X |
| 4,105,861 | 8/1978 | Hascoe | 357/74 X |
| 4,246,595 | 1/1981 | Noyori et al. | 357/70 |
| 4,251,852 | 2/1981 | Ecker et al. | 357/81 X |
| 4,446,477 | 5/1984 | Currie et al. | 357/71 R X |
| 4,544,989 | 10/1985 | Nakabu et al. | 357/81 X |

Primary Examiner—Martin H. Edlow
Assistant Examiner—Sara W. Crane
Attorney, Agent, or Firm—William S. Lovell; John Smith-Hill; John D. Winkelman

[57] ABSTRACT

An integrated circuit package comprises an integrated circuit chip and a flexible sheet-form interconnect member that comprises dielectric material and conductor runs supported by the dielectric material in mutually-insulated relationship and having termination points arranged at the main face of the interconnect member in a pattern that corresponds with the pattern of contact pads on the interconnect face of the chip. The chip and the interconnect member are adhesively bonded together by means of a material that is interposed between the main face of the interconnect member and the interconnect face of the chip, but is not interposed between the contact pads and the termination points, and adheres to both the interconnect member and the chip.

11 Claims, 8 Drawing Figures

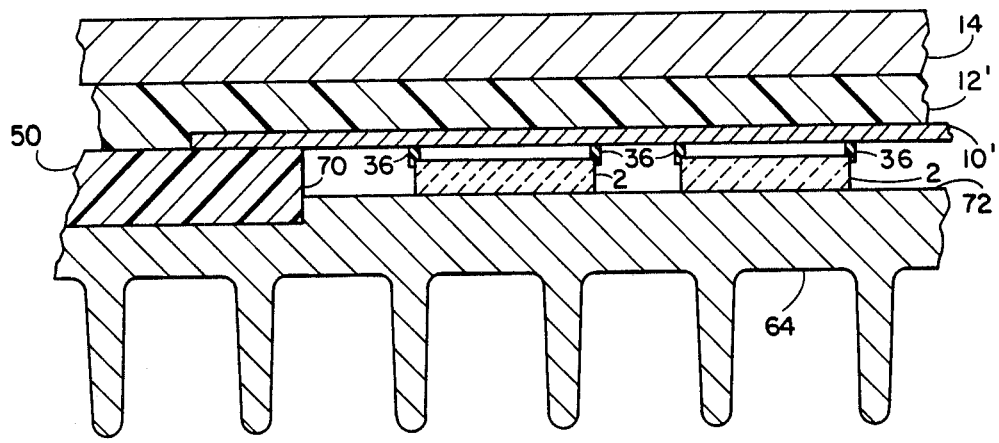
FIG. 8
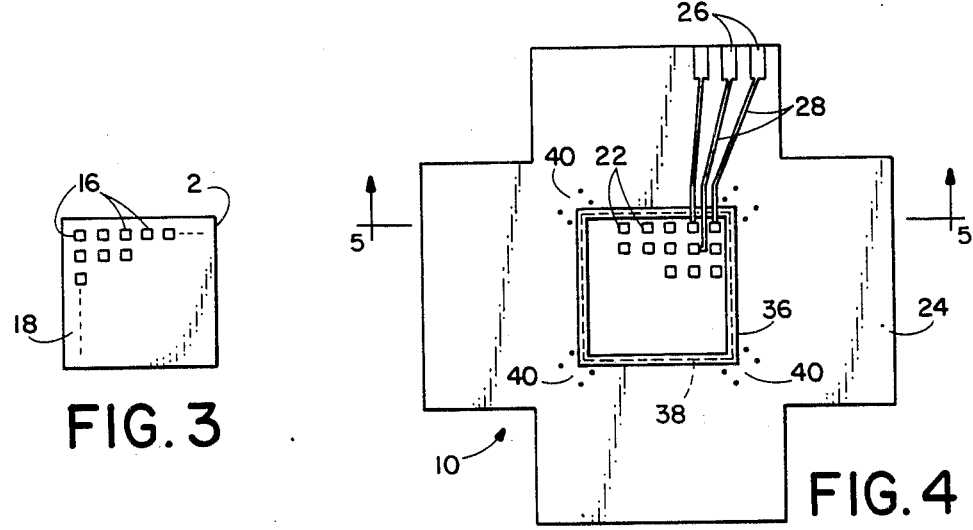
FIG. 3
FIG. 4
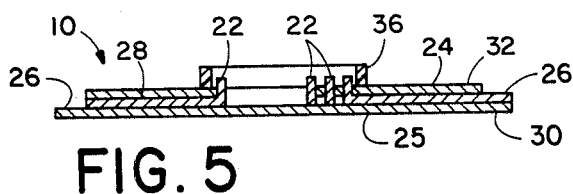
FIG. 5

4,647,959

INTEGRATED CIRCUIT PACKAGE, AND METHOD OF FORMING AN INTEGRATED CIRCUIT PACKAGE

This invention relates to an integrated circuit package, and a method of forming an integrated circuit package.

BACKGROUND OF THE INVENTION

It will be appreciated by those skilled in the art that in order to use an integrated circuit chip, it is necessary to make electrical connection to the integrated circuit incorporated within the chip. Traditionally, these connections have been made through contact pads located at one main face (hereinafter called the interconnect face) of the chip, utilizing bond wires. A chip is mounted on a substrate, e.g. of ceramic material, with its interconnect face uppermost, and a wire bonder is used to "stitch" bond wires between the IC pads and corresponding pads on the substrate. In a wire bonder, the bond wire is held against the pad during bonding by a rod-like or tubular tool. The dimensions of the tool, dictated by the need for rigidity, place a fairly large lower limit on the spacing between the pads on the IC. Typically, the pads are on at least six mil (one mil equals 0.001 inch, or approximately 0.025 mm.) centers. As the complexity of integrated circuits has increased, giving rise to demands for larger numbers of data and power supply lines, so has the scale of integration increased, reducing the needed size of the chip. The point has been reached where integrated circuit chips are being made larger than would be dictated by the complexity of the circuits in order to provide a sufficiently large interconnect face to accommodate the desired number of contact pads. In addition, the bond wire itself may introduce an undesirably large uncompensated inductance in the connection path.

Another method of mounting a chip to a substrate is known as the "flip-chip" technique. By this method, the substrate, e.g. of ceramic material, carries conductive strips that terminate at the perimeter of the footprint of the chip in a pattern of termination points corresponding to the pattern of pads on the chip, and the chip is placed on the substrate with its interconnect face down and its bond pads in direct physical contact with the termination points. The bond pads or the termination points carry solder preforms, and by applying heat and pressure through the chip a direct metallurgical bond is established between the chip's contact pads and the substrate's termination points. Through use of a multi-layer ceramic substrate the flip-chip technique allows the uncompensated inductance in the connections to the pads to be reduced. However, thermal mismatch between the chip and the substrate affects the reliability of the connections and may lead to damage to the chip.

A further problem that arises with conventional IC packaging techniques is that of heat dissipation. In the conventional ceramic packaging for IC chips, in which the chip is mounted on a ceramic substrate and the ceramic substrate is secured to an etched circuit board, the thermal flux through the substrate limits the packing density for discrete IC packages on the circuit board.

SUMMARY OF THE INVENTION

An integrated circuit package embodying the invention comprises an integrated circuit chip having a plurality of contact pads arranged in a first pattern on an interconnect face of the chip, and a sheet-form interconnect member that comprises flexible dielectric material and conductor runs supported by the dielectric material in mutually electrically-insulated relationship and having termination points arranged on a main face of the interconnect member in a second pattern corresponding with the first pattern. The chip and the interconnect member are positioned with the interconnect face of the chip and the main face of the interconnect member in mutually confronting relationship and the first pattern of contact pads and the second pattern of termination points in mutually registering relationship. The chip and the interconnect member are bonded together by means of a material that lies at least partially between the chip and the interconnect member but is not interposed between any of the contact pads and the corresponding termination points.

Also in accordance with the invention, a package for an integrated circuit chip having a plurality of contact pads arranged in a first pattern on an interconnect face of the chip is formed using a flexible, sheet-form interconnect member that comprises dielectric material and conductor runs supported by the dielectric material in mutually electrically-insulated relationship and having termination points arranged at a main face of the interconnect member in a second pattern that corresponds with the pattern of contact pads on the interconnect face of the chip. The interconnect face of the chip and the main face of the interconnect member are placed in mutually confronting relationship, and the relative positions of the chip and the interconnect member are adjusted so as to bring the first pattern of contact pads and the second pattern of termination points into mutually registering relationship. A bond is established between the chip and the interconnect member using a material that is provided over a portion of at least one of the confronting faces but is not interposed between the pads and the termination points.

By pressing the chip and the interconnect member together, a reliable pressure contact is established between the contact pads and the termination points.

BRIEF DESCRIPTION OF THE DRAWINGS

For a better understanding of the invention, and to show how the same may be carried into effect, reference will now be made, by way of example, to the accompanying drawings in which:

FIG. 3 is a plan view of an integrated circuit chip, FIG. 4 is a plan view of a flexible circuit that is used in manufacturing the package shown in FIG. 1, FIG. 5 is a sectional view taken on the line V—V of FIG. 4, FIG. 8 is a sectional view of an integrated circuit package including multiple IC chips.

DETAILED DESCRIPTION

Figure 1:
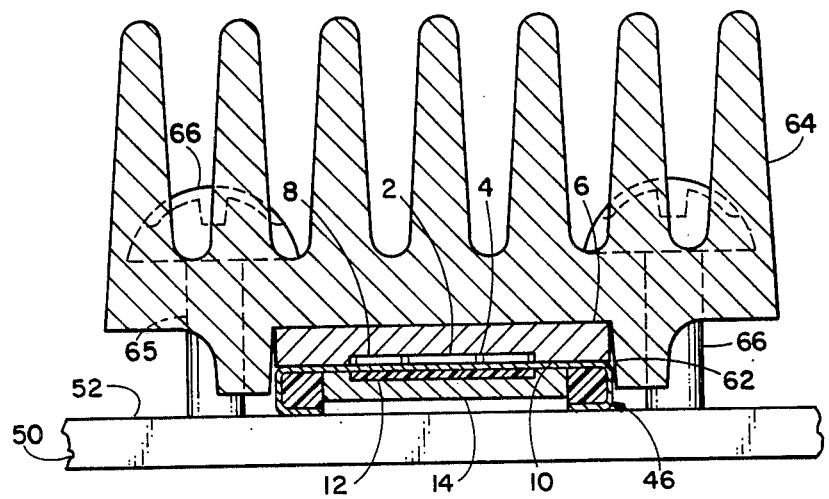
FIG. 1 is a cross-sectional view of an integrated circuit package mounted on a circuit board.

FIG. 1 illustrates an IC chip 2 that is received in a recess 4 formed in a plate 6 of aluminum. Also received in the recess 4 is a chip capacitor 8 that is used in conventional manner for by-passing power supply lines.

The chip is attached to a thin film flex circuit 10. The flex circuit 10 is secured at opposite main faces to the plate 6 and to a second aluminum plate 14. A body of elastomer 12 fills a recess in the plate 14, and presses the flex circuit against the chip 2.

Figure 2:
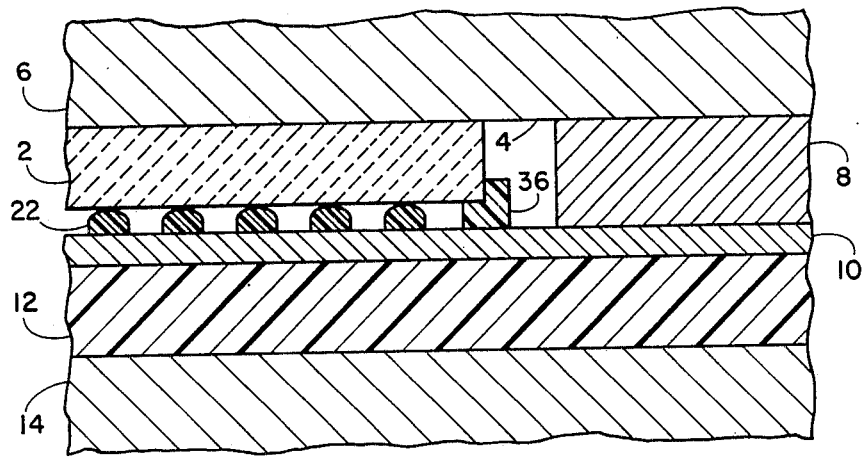
FIG. 2 is an enlarged view of a portion of FIG. 1.
Figure 6:
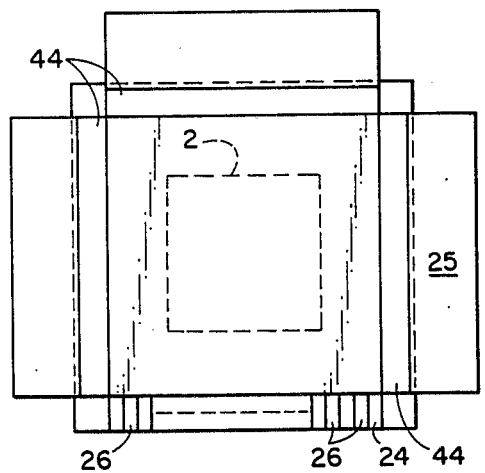
FIG. 6 is a plan view of the flexible circuit, seen from the opposite side from that shown in FIG. 4, at a later stage in manufacture of the package.

The chip 2 has an array of contact pads 16 (FIG. 3) on its interconnect face 18, which is the lower face of the chip as shown in FIGS. 1 and 2. The flex circuit 10 has a corresponding array of pressure contact bumps 22 at its upper main face 24, as shown in FIG. 5. The patterns of contact pads 16 and contact bumps 22 correspond in the sense that when the interconnect face 18 of the chip 2 is placed in confronting relationship with the face 24 of the flex circuit 10, the contact pads can be brought into electrical contact with the contact bumps respectively.

The flex circuit 10 includes peripheral contact pads 26 associated with the contact bumps 22 respectively, and conductor runs 28 connecting the pads 26 to the associated contact bumps 22.

As shown in FIG. 5, the flex circuit comprises a base layer 30 of elastic dielectric material, such as polyimide. Metal is deposited on the base layer 30 and is selectively etched to leave the contact pads 26, the conductor runs 28, and termination areas on which the contact bumps 22 are to be formed. The metallized face is masked leaving only the termination areas exposed, and metal is electrolytically deposited on the termination areas to form the bumps. The mask is removed, and a second layer 32 of polyimide is then deposited over the conductor runs 28, the bumps 22 and the exposed material of the lower layer 30. The layer 32 is then chemically etched to expose the bumps 22. A frame-like ridge 36 of thermoplastic adhesive is formed on the upper surface 24 of the flex circuit. The ridge 36 surrounds the pattern of contact bumps 22, but is sized so that it covers a marginal area of the footprint 38 of the chip. The adhesive may be, for example, partially cured (B-stage) polyimide and the ridge 36 is formed in situ by using selective etching techniques.

Prior to forming the ridge 36, alignment marks 40 are placed on the face 24 of the flex circuit at predetermined positions relative to the corners of the footprint of the chip. Each alignment or registration mark comprises a square array of dots, and in order for a corner of the chip to be properly positioned it must be equidistant from the two dots that are closer to the corresponding corner of the footprint. Because the corners of the chip are used for registration purposes, the corners must be accurately positioned relative to the pattern of contact pads 16. In the conventional method of dicing a wafer, the saw kerf position is controlled only to about 50 microns, but in order to insure accurate positioning of the corners, when a wafer is diced to provide chips that are to be packaged by the method described herein, the saw kerf position is controlled to within 10 microns of the center of the street defined between adjacent rows of chips. In addition, instead of sawing the wafer only part way through, so that the wafer remains self-supporting, and subsequently separating the wafer into individual chips, in the present method the wafer is secured to a separate support member and is sawed completely through, and the individual chips are then removed from the support member.

The flex circuit is placed on a microscope stage with the face 24 upwards, and the chip is held by a heatable vacuum collet over the face 24 of the flex circuit with the interconnect face 18 of the chip down. The chip is positioned immediately above the ridge 36, and the corners of the chip are aligned with the registration marks 40. The chip is then pressed downwards, and the heating element of the collet is energized. The heated collet drives heat through the chip and melts the adhesive of the ridge 36. The molten polyimide material is displaced from between the chip and the face 24, and the contact pads 16 enter into contact with the contact bumps 22. The collet is removed, and when the adhesive cools the chip is firmly bonded in place with the contact pads 16 positioned to enter into good electrically conductive contact with the bumps 22. The chip capacitor 8 is attached to the face 24 of the flex circuit, and the subassembly of the flex circuit 10, the chip 2 and the chip capacitor 8 may then be optically registered relative to the aluminum plate 6 and adhesively bonded thereto. The elastomer pressure pad 12 is fitted in the recess in the plate 14, and the plate 14 is adhesively bonded to the face 25 of the flex circuit. The pressure pad 12 provides the necessary contact force to maintain electrically-conductive contact between the contact pads 16 of the chip 2 and the contact bumps 22 of the flex circuit. At this point the chip may be tested, using the flex circuit to provide connections to the contact pads 16. If the chip is found to be defective, it can be easily sheared from the flex circuit 10 without damaging the flex circuit, and the flex circuit can be re-used. Thus, the B-stage polyimide material that is used for the ridge 36 is able to withstand several cycles of heating sufficient to receive and hold a new chip without becoming fully cross-linked and thereby losing its thermoplastic quality.

Strips 44 of elastomer are bonded to the face 25 of the flex circuit in the projecting edge regions 24, and the edge regions are wrapped around the strips 44 respectively and bonded to the strips. The terminal pads 26 are then disposed along the upper surfaces of the strips 44. The resulting package 46 can then be mounted to the circuit board 50.

In the case of the package shown in the drawings, mounting to the circuit board 50 is accomplished through a separate finned heat sink 64. The finned heat sink is formed with a recess 62 for receiving the package 46 and with holes 65 for receiving bolts for securing the heat sink, and through it the package 46, to the board 50. The plate 6 also serves as part of the heat sink. Alternatively, a one-piece heat sink could be employed, with the recess receiving the chip 2 and the chip capacitor 8 formed directly in the finned heat sink member.

Figure 7:
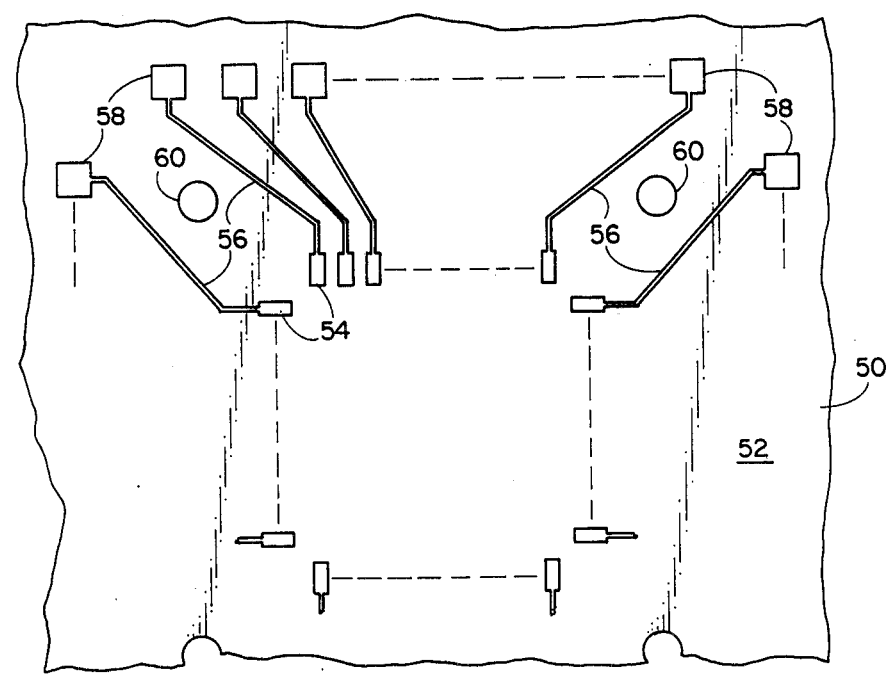
FIG. 7 is a plan view of a circuit board, to illustrate mounting of the package to the board.

As shown in FIG. 7, the circuit board has an upper face 52 on which is a pattern of contact pads 54 corresponding to the pattern of contact pads 26 of the IC package 46. The pads 54 are connected by conductor runs 56 to pads 58, which are in turn connected through vias of the circuit board to interior conductor runs. The pads 26 and 54 are each about 12 mils wide and are on 25 mil centers. Therefore, in order to assure reliable connections between the IC package and the circuit board, the package must be positioned to within about 7 mils. Holes 60 are formed in the circuit board and are positioned relative to the pattern of pads 54 to within a tolerance of about 2 mils. The tolerances on the size of the recess 62 are such that the pattern of pads 26 is positioned relative to the holes 65 to within about 4 mils. Accordingly, when the heat sink is secured to the circuit board 50 using bolts that pass through the holes 60 and 64 and the diameters of which are within 1 mil of the diameter of the holes 60 and 65, the pads 26 will make contact with the appropriate pads 54. The bolts 66 maintain good pressure contact between the pads 26 and the pads 54.

In the particular IC package that is illustrated, it is not necessary to isolate the bulk chip material electrically, and therefore no organic or ceramic material is interposed between the chip and the heat sink 64. Consequently, the thermal resistance between the chip and the heat sink is low. However, if it should be necessary to isolate the chip electrically from the heat sink, a thin coating of dielectric material could be provided on the back face of the chip or on the interior of the recess in the plate 4, and acceptable thermal contact between the chip and the heat sink would be preserved.

Through use of a flex circuit and pressure contacts to establish electrical connection to the chip, instead of the conventional flip chip in which the chip is metallurgically bonded to a ceramic substrate, stressing due to differential thermal expansion is avoided. Similarly, the pressure contact between the pads 26 and the pads 54 avoids such stressing of the circuit board itself. The strips 44 of elastomer provide compliance over the pressure interconnect between the flex circuit and the circuit board.

In the case of FIG. 8, multiple IC chips 2 are bonded to the flex circuit 10', which is a multilayer flex circuit having multiple patterns of contact bumps (not shown) corresponding to the patterns of contact pads (not shown) on the chips 2 respectively. The flex circuit is bonded to a layer of elastomer 12', which is molded in situ to the flex circuit. The chips 2 are received in an opening 70 in the circuit board 50, and the back faces of the chips 2 make direct pressure contact with a pedestal portion 72 of a heat sink 64. The heat sink 64 is secured to a pressure plate 14 by bolts (not shown), and the elastomer layer 12' provides contact force to establish reliable pressure contact between the contact pads of the chips 2 and the contact bumps of the flex circuit 10', and between peripheral contact pads (not shown) of the flex circuit 10' and contact pads (not shown) of the board 50. The multilayer flex circuit includes ground planes.

It will be appreciated that the invention is not restricted to the particular integrated circuit packages, and methods of forming electrical connections to an integrated circuit chip, that have been described, and variations may be made therein without departing from the scope of the invention as defined in the appended claims, and equivalents thereof. For example, instead of establishing alignment of the pads 26 of the flex circuit relative to the pads 54 of the circuit board through the plate 4, the heat sink 64, the bolts 66 and the circuit board 50, with the accumulation of possible errors over four mechanical alignments, if the plate 14 is accurately aligned relative to the flex circuit and is provided with alignment posts that fit in holes in the circuit board, the number of mechanical alignments at which errors can occur is reduced to three, and the most error-prone (the diameter of the bolts 66) is eliminated. The invention is not restricted to use of any particular dielectric material for the flex circuit 10 or any particular adhesive material for the ridge 36, and different materials may be used for the two components respectively. The configuration of the ridge is not critical, and the body of B-stage polyimide material, or other suitable material, may have any other form that allows it to hold the chip to the flex circuit without interfering with the electrical connections between the pads 16 and the bumps 22. The flex circuit 10 may be a multiple layer flex circuit, including ground planes. Moreover, it is not necessary that the material used for attaching the chip to the flex circuit be dielectric. If a chip is designed to have sacrificial pads, i.e. pads that are not connected to the internal circuit components of the chip, and the flex circuit has corresponding sacrificial bumps, the chip may be attached to the circuit by establishing a metallurgical bond, e.g. by soldering, welding or using thermocompression or thermosonic techniques, between the sacrificial pads of the chip and the sacrificial bumps of the flex circuit. Possible deterioration of the metallurgical bond due to thermal expansion mismatches is not important, since the bond serves only the temporary purpose of maintaining alignment between the chip and the flex circuit until the chip/flex circuit sub-assembly is installed in the heat sink, and does not serve any electrical purpose. Sacrificial pads are not considered to be contact pads, because they are not used for establishing electrical contact to the internal circuit components of the chip.

I claim:

1. An integrated circuit package comprising an integrated circuit chip having a plurality of contact pads arranged in a first pattern on an interconnect face of the chip, a flexible sheet-form interconnect member that comprises dielectric material and conductor runs supported by said electric material in mutually electrically-insulated relationship and having termination points arranged on a main face of said interconnect member in a second pattern that corresponds with said first pattern, said first pattern of contact pads and said second pattern of termination points being in mutually registering relationship and said contact pads being in mechanical registration with, but not metallurgically bonded to, said termination points, and the package further comprising attachment material in adhesive relationship with both the chip and the interconnect member but not interposed between any of said contact pads and said termination points, a metallic plate member defining a recess and having a marginal surface region that surrounds said recess, said metallic plate member being secured at said marginal surface region to said main face of the interconnect member with the chip disposed in said recess, a second plate member secured to the interconnect member at its face opposite said main face, and a pad of resilient material interposed between said second plate member and the interconnect member and providing contact force to establish pressure contact between said contact pads and said termination points.

2. A package according to claim 1, wherein said attachment material has thermoplastic properties.

3. A package according to claim 1, wherein said attachment material is a dielectric material.

4. A package according to claim 3, wherein said attachment material is a B-stage polyimide material.

5. A method of forming a package for an integrated circuit chip having a plurality of contact pads arranged in a first pattern on an interconnect face of the chip, using a flexible sheet-form interconnect member that comprises dielectric material and conductor runs supported by said dielectric material in mutually electrically-insulated relationship and having termination points arranged at a main face of said interconnect member in a second pattern that corresponds with said first pattern, and the method comprising providing attachment material in adhesive relationship with a portion of at least one of said faces, placing said interconnect face of the chip and said main face of the interconnect member in mutually confronting relationship, bringing said first pattern of contact pads and said second pattern of termination points into mutually registering relationship, establishing adhesive relationship between said attachment material and the other of said faces, and placing a pad of elastic material and the assembly of the chip and the interconnect member between first and second plate members having spaced, generally parallel, confronting faces, with the pad disposed between said assembly and one of said plates and providing contact force to establish pressure contact between said contact pads and said termination points.

6. A method according to claim 5, wherein the attachment material is a partially-cured polyimide material and the step of establishing adhesive relationship between said attachment material and said other face comprises completing curing of the polyimide material.

7. An integrated circuit package comprising an integrated circuit chip having a plurality of contact pads arranged in a first pattern on an interconnect face of the chip, a flexible sheet-form interconnect member that comprises dielectric material and conductor runs supported by said dielectric material in mutually-electrically insulated relationship and having termination points arranged on a first main face of said interconnect member in a second pattern that corresponds with said first pattern, said first pattern of contact pads and said second pattern of termination points being in mutually registering relationship and said contact pads being in mechanical registration with, but not metallurgically bonded to, said termination points, and the package further comprising attachment material in adhesive relationship with both the chip and the interconnect member but not interposed between any of said contact pads and said termination points, and first and second plate members having spaced, generally parallel, confronting faces, the assembly of the chip and the interconnect member being interposed between the first and second plate members, and the package also comprising a pad of elastic material disposed between said assembly and one of said plate members and providing contact force to establish pressure contact between said contact pads and said termination points.

8. A package according to claim 7, wherein the chip has a main face opposite its interconnect face and in contact with the first plate member, the first plate member is made of metal, and the pad of elastic material is disposed between said assembly and the second plate member.

9. A package according to claim 7, wherein said attachment material has thermoplastic properties.

10. A package according to claim 7, wherein said attachment material is a dielectric material.

11. A package according to claim 10, wherein said attachment material is a B-stage polyimide material.

* * * * *